United States Patent

Hayakawa et al.

[11] Patent Number: 6,043,989
[45] Date of Patent: Mar. 28, 2000

[54] STATIC ELECTRICITY REMOVING STRUCTURE FOR PORTABLE ELECTRONIC DEVICES

[75] Inventors: Haruo Hayakawa; Yoshinori Miyajima, both of Yokohama, Japan

[73] Assignee: Matsushita Electric Industrial Co., Ltd., Osaka, Japan

[21] Appl. No.: 09/080,269

[22] Filed: May 18, 1998

[30] Foreign Application Priority Data

May 22, 1997 [JP] Japan ................................. 9-131862

[51] Int. Cl.[7] ............................... H05K 9/00; H05F 3/00

[52] U.S. Cl. .......................... 361/800; 361/220; 361/752; 361/753; 361/799; 361/816

[58] Field of Search ...................... 361/212, 220, 361/752, 753, 777, 799, 800, 816, 818; 439/92, 101, 397; 174/5 R, 55 G, 51; 307/100

[56] References Cited

U.S. PATENT DOCUMENTS

| | | | |
|---|---|---|---|
| 4,223,368 | 9/1980 | Dattilo | 361/220 |
| 4,667,266 | 5/1987 | Masuoka et al. | 361/212 |
| 4,821,320 | 4/1989 | Andert et al. | 361/212 X |
| 5,029,041 | 7/1991 | Robinson et al. | 361/220 |
| 5,708,552 | 1/1998 | Han et al. | 361/799 |

*Primary Examiner*—Gerald Tolin
*Assistant Examiner*—Jayprakash N. Gandhi
*Attorney, Agent, or Firm*—Pollock, Vande Sande & Amernick

[57] ABSTRACT

A printed circuit board with an electronic component and a wiring pattern is fixed in a casing. A static electricity removing member is provided at an edge of the printed circuit board adjacent to an inlet of the casing through which static electricity inters into the casing. Preferably, the static electricity removing member is a throughhole-like or semi-circular conductive member with opposed sharp edges electrically connected to a ground terminal via a resistor or a low-pass filter.

11 Claims, 2 Drawing Sheets

STATIC ELECTRICITY REMOVING STRUCTURE FOR PORTABLE ELECTRONIC DEVICES

BACKGROUND OF THE INVENTION

The present invention relates to a static electricity removing structure for a portable electronic device which incorporates a printed circuit board with an electronic component and a wiring pattern formed thereon.

Downsizing and lightweight designs for the present portable electronic devices have been improved in accordance with related progresses in semiconductor techniques and mounting techniques. However, downsizing and lightweight designs of electronic devices possibly encounter electrostatic problems.

Static electricity enters from the outside of a casing into a portable electronic device. Some of electronic components, such as transistors, are weak in durability against the static electricity. Thus, there is a possibility that static electricity may break the sensitive electronic components. Furthermore, the static electricity causes noises. If such noises enter into a signal line, for example, via a switch, various control circuits will malfunction.

FIGS. 3 and 4 show some of conventional static electricity removing structures applied to portable electronic devices.

In FIG. 3, a portable electronic device comprises a printed circuit board 1. An electronic component 2 and a wiring pattern 3 are formed on the printed circuit board 1. The printed circuit board 1 is securely fixed in a casing 4. Static electricity tends to enter into the casing 4 via a clearance or hole 5. An insulating sheet 6 is provided in the vicinity of the electronic component 2 and the wiring pattern 3 as measures for preventing the static electricity.

FIG. 4 shows a silicone resin 7 molding the electronic component 2 and the wiring pattern 3 as other measures for preventing the static electricity.

However, providing the insulating sheet 6 in the vicinity of the electronic component 2 and the wiring pattern 3 or molding them by the silicone resin 7 is not preferable in that the number of parts will increase and the working steps in a manufacturing process will increase correspondingly. This possibly raises the product costs and worsens the productivity in the manufacturing process.

SUMMARY OF THE INVENTION

In view of the foregoing problems, the present invention has an object to provide a static electricity removing structure for a portable electronic device which incorporates a printed circuit board with an electronic component and a wiring pattern formed thereon. The present invention provides a portable electronic device excellent in the durability against static electricity without relying on the conventional insulating sheet provided in the vicinity of the electronic component and the wiring pattern or the silicone resin used for molding the same.

In order to accomplish the above and other related objects, the present invention provides a portable electronic device comprising a printed circuit board, a casing for accommodating the printed circuit board, and a static electricity removing member provided at an edge of the printed circuit board adjacent to an inlet of the casing through which static electricity enters into the casing.

Preferably, the static electricity removing member is a conductive member electrically connected to a ground terminal. The static electricity removing member is connected to the ground terminal via a conductive pathway formed on the printed circuit board.

Preferably, the static electricity removing member is connected to a ground terminal via a noise level reducing member. The noise level reducing member is selected from the group consisting of a resistor and a low-pass filter.

Preferably, the static electricity removing member forms a through hole as a static electricity removing portion or a recessed portion as a static electricity removing portion. The recessed portion may be semi-circular.

Preferably, the static electricity removing member has opposed edges for discharging static electricity.

Preferably, the static electricity removing member is located closer to the inlet of the casing than an electronic component and a wiring pattern formed on the printed circuit board. The inlet may be a clearance or a hole opened on the casing.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
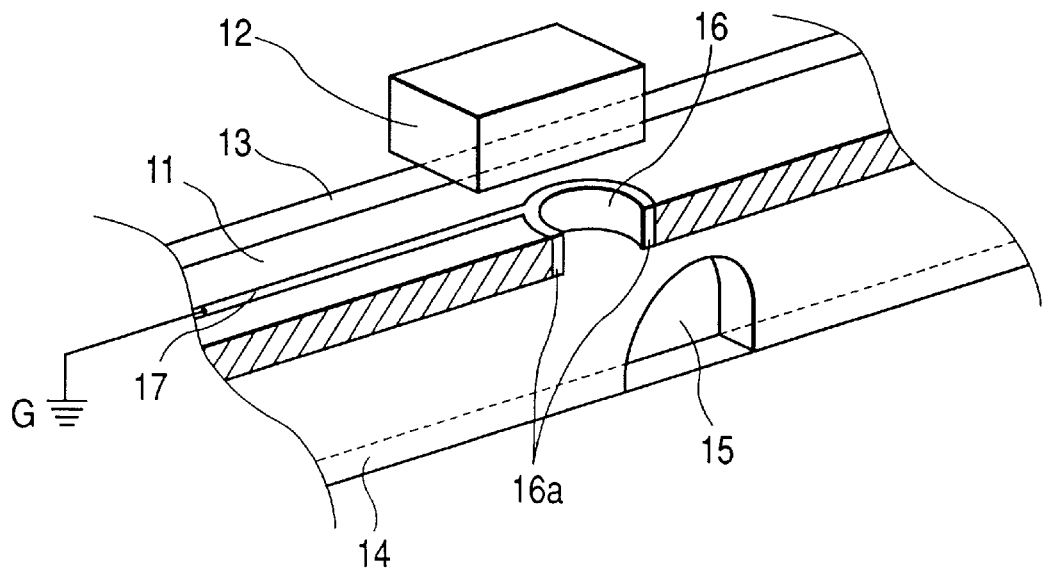
FIG. 1 is a perspective view showing a schematic arrangement of a static electricity removing structure in accordance with an embodiment of the present invention.

Preferred embodiments of the present invention will be explained in more detail with reference to FIGS. 1 and 2. Identical parts are denoted by the same reference numerals throughout the views.

FIG. 1 shows a static electricity removing structure for a portable electronic device in accordance with a preferable embodiment of the present invention. In FIG. 1, a portable electronic device comprises a printed circuit board 11. An electronic component 12 and a wiring pattern 13 are formed on the printed circuit board 11. The printed circuit board 11 is securely fixed in a casing 14. Static electricity tends to enter into the casing 14 via an inlet 15, such as a clearance or a hole, opened on the casing 14. A static electricity removing member 16, forming a thorough hole (i.e., a semi-circular recess), is provided at an edge of the printed circuit board 11 in the vicinity of the clearance (or hole) 15. The static electricity removing member 16, being a semi-circular conductive member, has opposed sharp edges 16a and 16a. The static electricity removing member 16 is electrically connected to a ground terminal G of the portable electronic device via a conductive pathway 17 formed on the printed circuit board 11. As the static electricity removing member 16, forming the through hole (or the semi-circular recessed portion), is located adjacent to the inlet 15, the static electricity entering from the inlet 15 is discharged between the opposed sharp edges 16a and 16a of the static electricity removing member 16 before the static electricity reaches the electronic component 12 and the wiring pattern 13. Otherwise, the static electricity is erased through the conductive pathway 17 connected to the ground terminal G. In this manner, the electronic component 12 and the wiring pattern 13 are surely protected from the static electricity.

Figure 2:
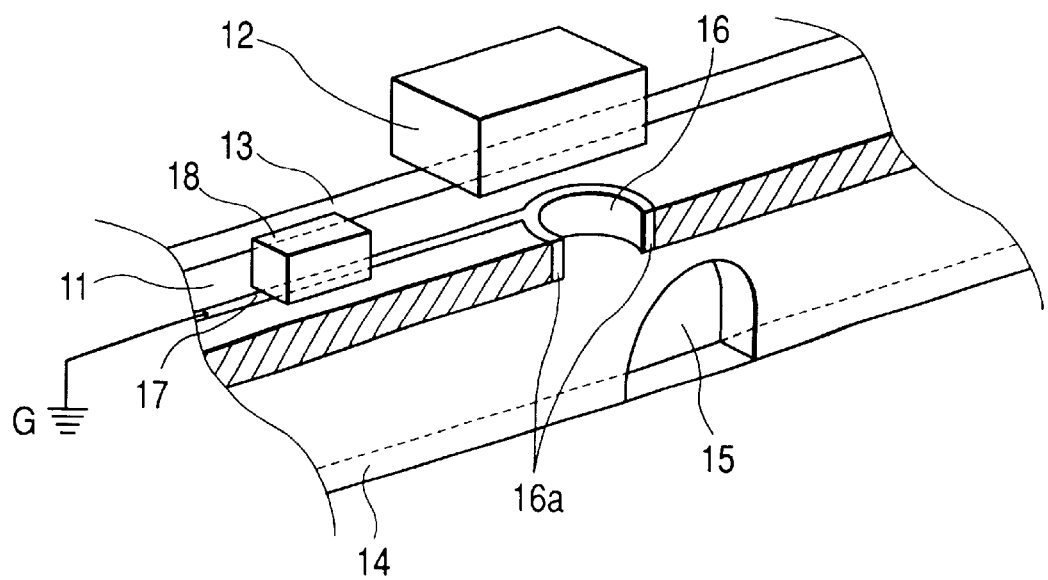
FIG. 2 is a perspective view showing a schematic arrangement of a static electricity removing structure in accordance with another embodiment of the present invention.
Figure 3:
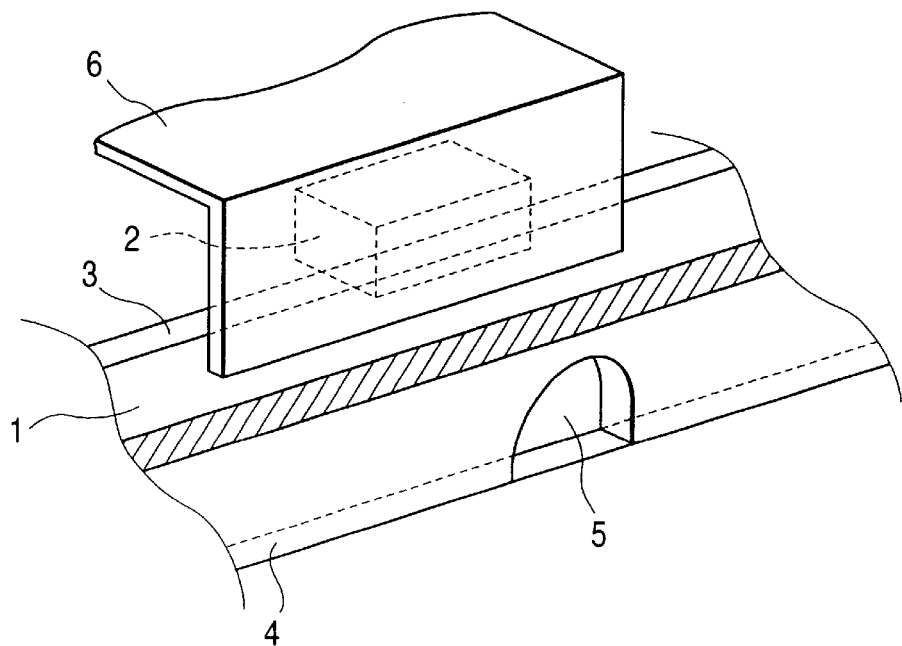
FIG. 3 is a perspective view showing a schematic arrangement of a conventional static electricity removing structure.
Figure 4:
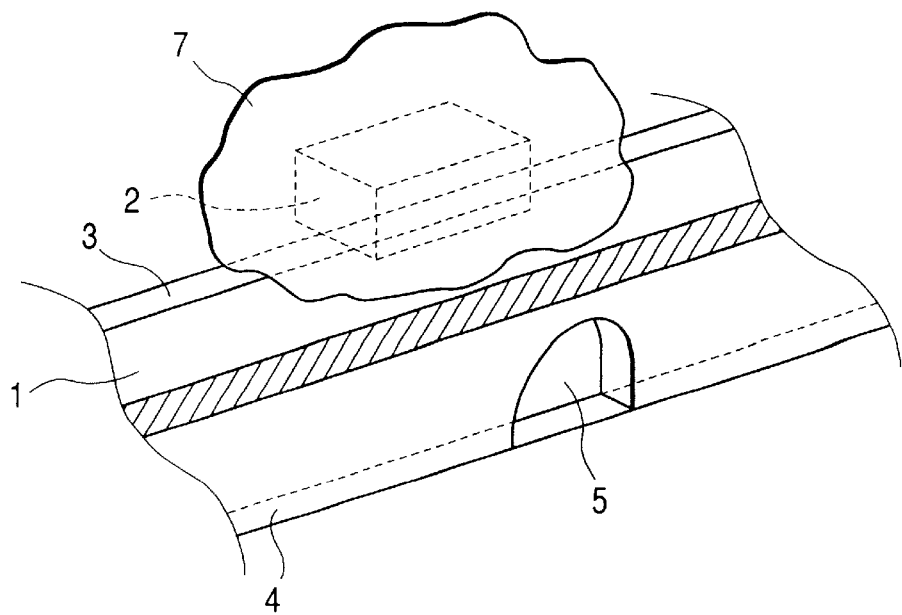
FIG. 4 is a perspective view showing a schematic arrangement of another conventional static electricity removing structure.

FIG. 2 shows a static electricity removing structure for a portable electronic device in accordance with another embodiment of the present invention. In FIG. 2, a noise level reducing member 18, such as a resistor or a low-pass filter, is provided as a circuit component interposed in the conductive pathway 17. Providing the noise level reducing member 18 between the static electricity removing member 16 and the ground terminal G is effective to surely reduce or eliminate the electrostatic noises. This arrangement makes it possible to prevent break of the electronic component 12 or malfunctions of various control circuits, even when a ground potential of the portable electronic device is unstable.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A portable electronic device comprising:
    a printed circuit board;
    a casing for accommodating said printed circuit board; and
    a static electricity removing member forming a conductive recessed portion along an edge of said printed circuit board adjacent to an inlet of said casing through which static electricity enters into said casing.

2. The portable electronic device in accordance with claim 1, wherein said static electricity removing member is a conductive member electrically connected to a ground terminal.

3. The portable electronic device in accordance with claim 2, wherein said static electricity removing member is connected to said ground terminal via a conductive pathway formed on said printed circuit board.

4. The portable electronic device in accordance with claim 1, wherein said static electricity removing member is connected to a ground terminal via a noise level reducing member.

5. The portable electronic device in accordance with claim 4, wherein said noise level reducing member is selected from the group consisting of a resistor and a low-pass filter.

6. The portable electronic device in accordance with claim 1, wherein said static electricity removing member forms a through hole as a static electricity removing portion.

7. The portable electronic device in accordance with claim 1, wherein said recessed portion is semi-circular.

8. The portable electronic device in accordance with claim 1, wherein said static electricity removing member has opposed edges for discharging static electricity.

9. The portable electronic device in accordance with claim 1, wherein said static electricity removing member is located closer to said inlet of said casing than an electronic component and a wiring pattern formed on said printed circuit board.

10. The portable electronic device in accordance with claim 1, wherein said inlet is a clearance or a hole in said casing.

11. The portable electronic device in accordance with claim 1 wherein said static electricity removing member is a conductive member formed along a recess in said edge of said printed circuit, said conductor having opposed edges facing said inlet, said conductive member being connected to a ground terminal whereby a static discharge entering said inlet is discharged to ground.

* * * * *